United States Patent
Matsui et al.

(10) Patent No.: US 7,985,685 B2
(45) Date of Patent: Jul. 26, 2011

(54) METHOD OF MANUFACTURING SEMICONDUCTOR DEVICE

(75) Inventors: Yukiteru Matsui, Yokohama (JP); Masako Kinoshita, Yokohama (JP); Seiro Miyoshi, Yokohama (JP); Yoshikuni Tateyama, Hiratsuka (JP); Takeshi Nishioka, Yokohama (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 12/262,439

(22) Filed: Oct. 31, 2008

(65) Prior Publication Data

US 2009/0124076 A1    May 14, 2009

(30) Foreign Application Priority Data

Nov. 12, 2007 (JP) .................................. 2007-293581

(51) Int. Cl.
*H01L 21/311* (2006.01)

(52) U.S. Cl. .... 438/700; 438/637; 438/702; 257/E21.58

(58) Field of Classification Search .......... 438/622–624, 438/633, 637–640, 700, 702; 257/E21.576, 257/E21.58

See application file for complete search history.

(56) References Cited

U.S. PATENT DOCUMENTS

| | | |
|---|---|---|
| 2004/0253822 A1 | 12/2004 | Matsui et al. |
| 2005/0266355 A1 | 12/2005 | Matsui et al. |
| 2007/0000872 A1 | 1/2007 | Matsui et al. |
| 2007/0128874 A1 | 6/2007 | Shida et al. |

FOREIGN PATENT DOCUMENTS

| | | |
|---|---|---|
| JP | 2004-363191 | 12/2004 |
| JP | 2005-268409 | 9/2005 |
| JP | 2006-19690 | 1/2006 |
| JP | 2006-19696 | 1/2006 |
| JP | 2007-150184 | 6/2007 |

*Primary Examiner* — Thanhha Pham
(74) *Attorney, Agent, or Firm* — Finnegan, Henderson, Farabow, Garrett & Dunner, L.L.P.

(57) ABSTRACT

A method for manufacturing a semiconductor device is provided, the method includes forming a coated film by coating a solution containing a solvent and an organic component above an insulating film located above a semiconductor substrate and having a recess, baking the coated film at a first temperature which does not accomplish cross-linking of the organic component to obtain an organic film precursor, polishing the organic film precursor using a slurry containing resin particles to leave the organic film precursor in the recess, baking the left organic film precursor at a second temperature which is higher than the first temperature to remove the solvent to obtain a first organic film embedded in the recess, forming a second organic film on the insulating film, thereby obtaining an underlying film, forming an intermediate layer and a resist film successively above the underlying film, and subjecting the resist film to patterning exposure.

20 Claims, 9 Drawing Sheets

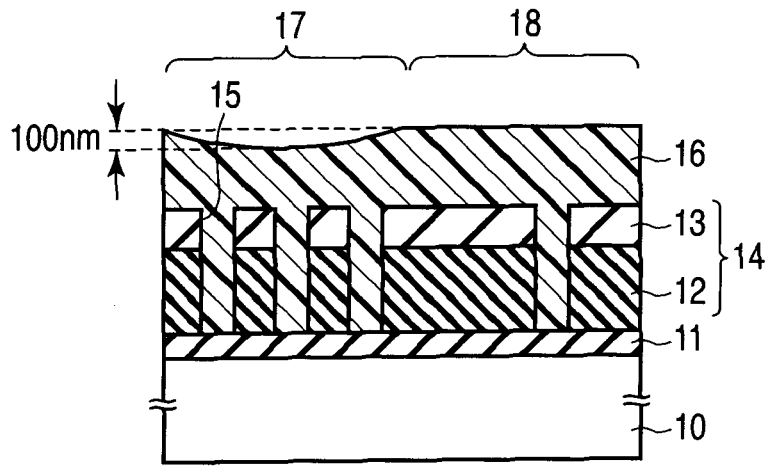
F I G. 1
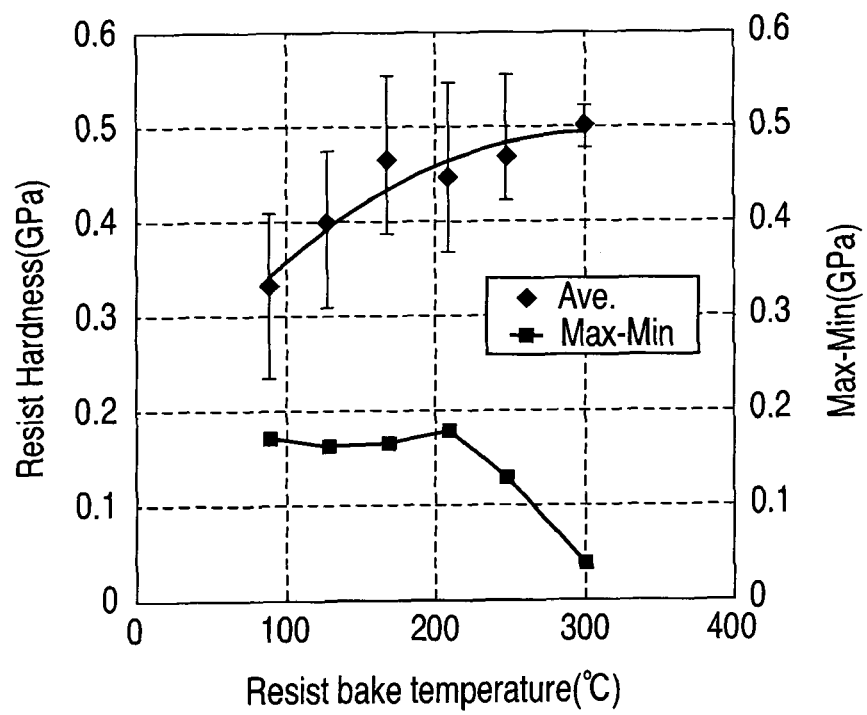
F I G. 2

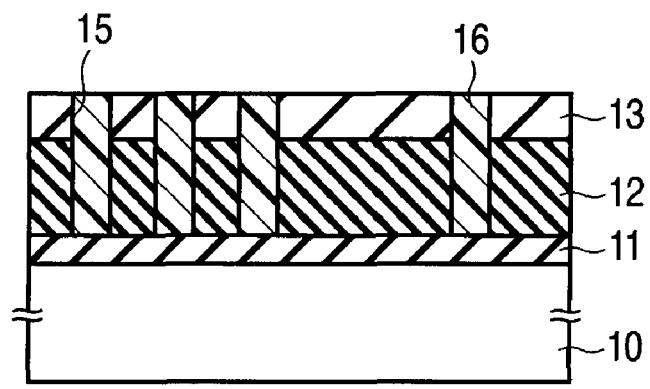
F I G. 3
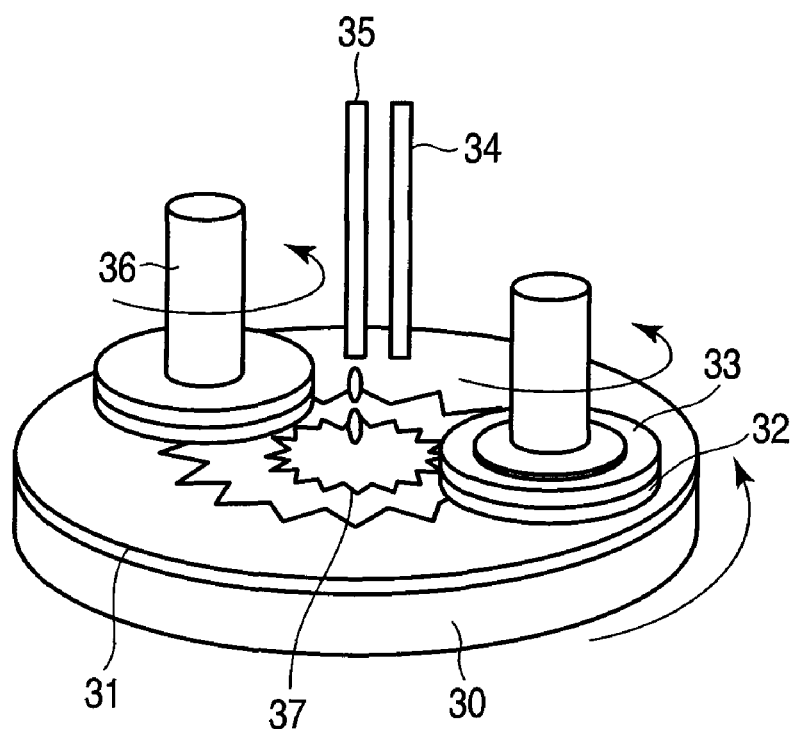
F I G. 4

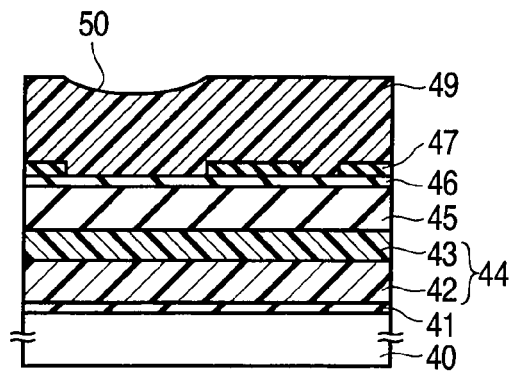
F I G. 11
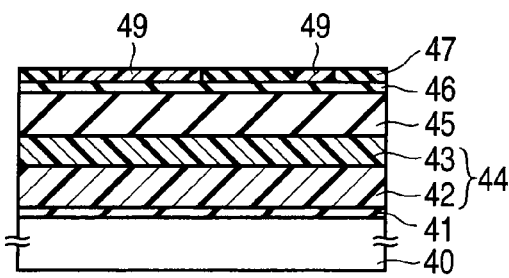
F I G. 12
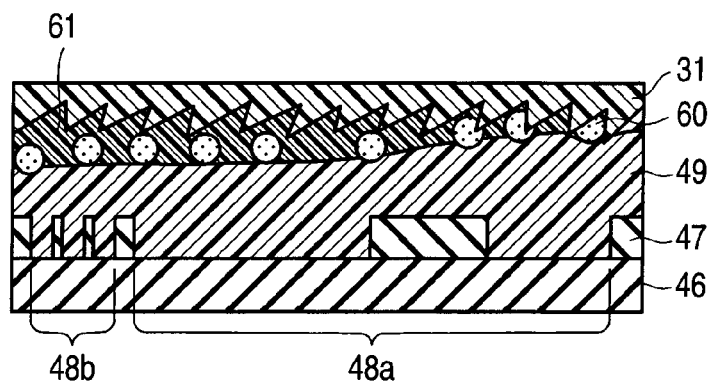
F I G. 13

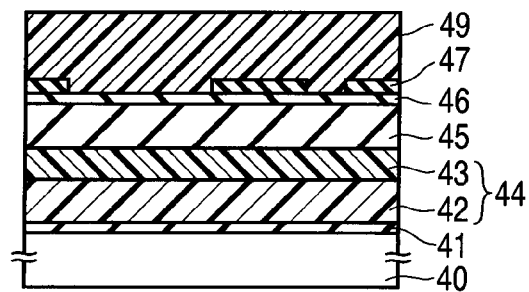
F I G. 14
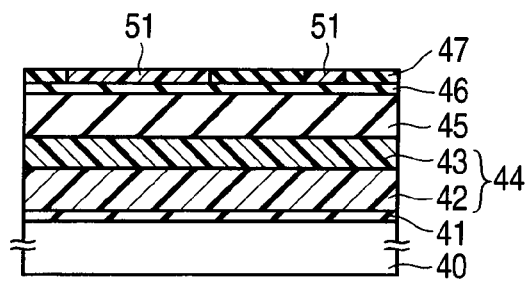
F I G. 15
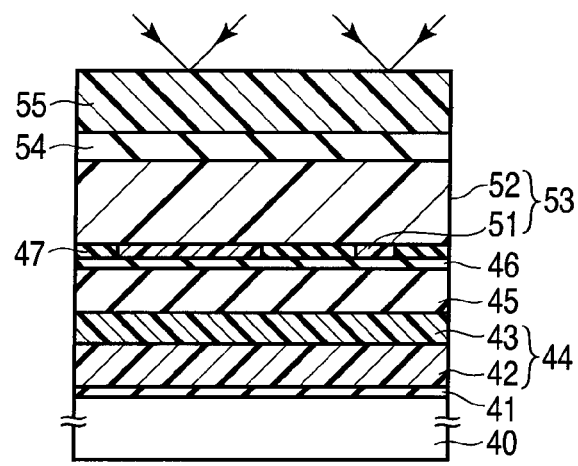
F I G. 16

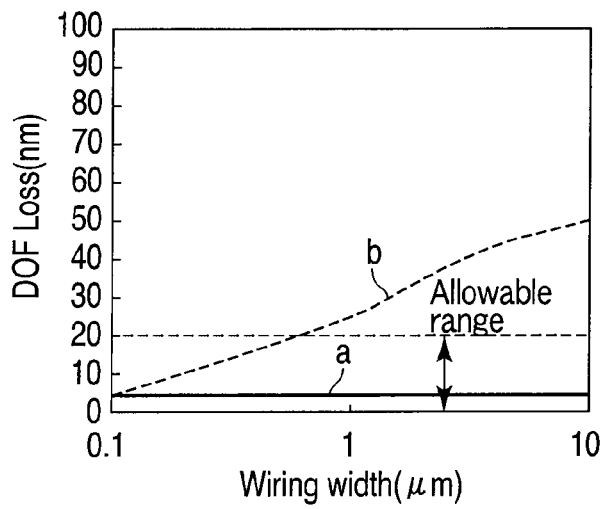
F I G. 19
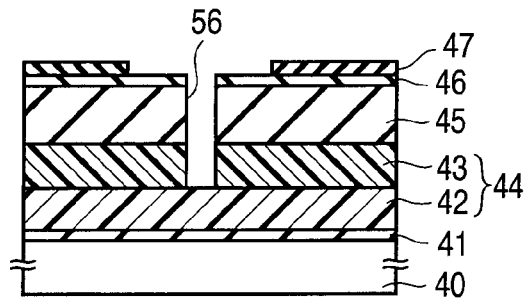
F I G. 20
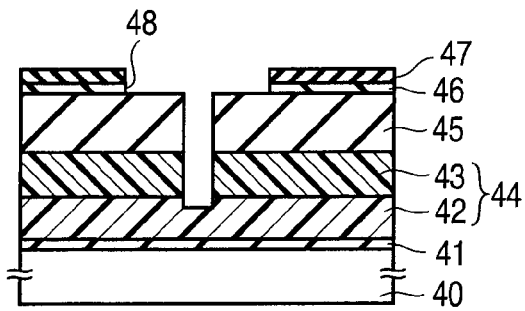
F I G. 21

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2007-293581, filed Nov. 12, 2007, the entire contents of which are incorporated herein by reference.

BACKGROUND OF THE INVENTION

1. Field of the Invention

This invention relates to a method of manufacturing a semiconductor device.

2. Description of the Related Art

In the process for forming a dual damascene wiring structure of a semiconductor integrated circuit device, it is required to planarize an organic film employed as an underlying film. The planarization of the organic film has been conventionally employed for the via-first formation or so-called via-first in a dual damascene process wherein a trench pattern is formed after the formation of a hole pattern (via-hole pattern).

As described in JP-A 2004-363191 (KOKAI) for example, in the planarization of an organic film according to this process, a slurry containing resin particles is employed, for example. According to this process, the magnitude of dishing can be inhibited by regulating the size of resin particles to a range larger than the diameter of a hole.

Further, in viewpoint of the controllability of working and shaping, it is considered more advantageous to employ a hybrid-type interlayer insulating film structure. In the case of the hybrid dual damascene process, there has been mainly adopted a dual damascene process of the so-called trench mask-first, wherein a hard mask is worked so as to form a wiring trench.

In the working process of the trench mask-first, for the purpose of forming a wiring trench and a connecting hole by a hard mask consisting of a plurality of layers, there has been proposed, as seen in JP-A 2006-019690 (KOKAI) for example, to form an underlying film, and then the surface of the underlying film is planarized by a CMP method. In this process, an organic film is formed on the hard mask having a wiring trench formed therein, by coating and then baking at a high temperature exceeding the cross-linking temperature thereof to form a film which is high in hardness. Subsequently, this hard organic film is removed by CMP using alumina particles, thereby inhibiting the magnitude of dishing.

However, this working process is accompanied with a problem that a deep scratch that may damage the hard mask may generate due to the alumina particles. The reason is that alumina particles are the highest in hardness of abrasive grains. Further, when alumina particles are left after the polishing of the organic film, they may act as an etching mask in a subsequent working process. As a result, an abnormal configuration may generate in the worked wirings, thus decreasing the yield of wirings.

BRIEF SUMMARY OF THE INVENTION

A method for manufacturing a semiconductor device according to one aspect of the present invention comprises:

forming a coated film by coating a solution containing a solvent and an organic component above an insulating film located above a semiconductor substrate and having a recess;

baking the coated film at a first temperature which does not accomplish cross-linking of the organic component to obtain an organic film precursor;

polishing the organic film precursor using a slurry containing resin particles to leave the organic film precursor in the recess;

baking the organic film precursor left in the recess at a second temperature which is higher than the first temperature to remove the solvent to obtain a first organic film embedded in the recess;

forming a second organic film by coating on the insulating film where the first organic film is embedded, thereby obtaining an underlying film;

forming an intermediate layer and a resist film successively above the underlying film; and subjecting the resist film to patterning exposure.

A method for manufacturing a semiconductor device according to another aspect of the present invention comprises:

forming a coated film by coating a solution containing a solvent and an organic component above an interlayer insulating film located above a semiconductor substrate and having a hole;

baking the coated film at a first temperature which does not accomplish cross-linking of the organic component to obtain an organic film precursor;

polishing the organic film precursor using a slurry containing resin particles to leave the organic film precursor in the hole;

baking the organic film precursor left in the hole at a second temperature which is higher than the first temperature to remove the solvent to obtain a first organic film embedded in the hole;

forming a second organic film by coating on the interlayer insulating film where the first organic film is embedded, thereby obtaining an underlying film;

forming an intermediate layer and a resist film successively above the underlying film; and subjecting the resist film to patterning exposure.

A method for manufacturing a semiconductor device according to another aspect of the present invention comprises:

forming, through at least an organic insulating film, a first hard mask containing an inorganic material and a second hard mask containing an inorganic material, a third hard mask containing an inorganic material above a semiconductor substrate;

forming a pattern of a wiring trench to be transcribed to the organic insulating film in the third hard mask, thereby exposing the second hard mask on a bottom of the pattern;

forming a coated film by coating a solution containing a solvent and an organic component above the third hard mask where the pattern of the wiring trench is formed;

baking the coated film at a first temperature which does not accomplish cross-linking of the organic component to obtain an organic film precursor;

polishing the organic film precursor using a slurry containing resin particles to leave the organic film precursor in the pattern of the wiring trench;

baking the organic film precursor left in the pattern of the wiring trench at a second temperature which is higher than the first temperature to remove the solvent to obtain a first organic film embedded in the pattern of the wiring trench;

forming a second organic film by coating on the third hard mask where the first organic film is embedded, thereby obtaining an underlying film;

forming an intermediate layer and a resist film successively above the underlying film; and subjecting the resist film to patterning exposure.

BRIEF DESCRIPTION OF THE SEVERAL VIEWS OF THE DRAWING

FIG. 1 is a cross-sectional view illustrating one step in the method of manufacturing a semiconductor device according to one embodiment;

FIG. 2 is a graph illustrating the relationship between the baking temperature and the hardness;

FIG. 3 is a cross-sectional view illustrating a step following the step shown in FIG. 1;

FIG. 4 is a perspective view schematically illustrating a state of CMP (Chemical Mechanical Polishing) in one embodiment;

FIG. 11 is a cross-sectional view illustrating a step following the step shown in FIG. 10;

FIG. 12 is a cross-sectional view illustrating a step following the step shown in FIG. 11;

FIG. 13 is a cross-sectional view schematically illustrating the polishing mechanism in another embodiment;

FIG. 14 is a cross-sectional view illustrating part of the step of FIG. 12;

FIG. 15 is a cross-sectional view illustrating a step following the step shown in FIG. 12;

FIG. 16 is a cross-sectional view illustrating a step following the step shown in FIG. 15;

FIG. 19 is a graph illustrating the relationship between the wiring line width and the DOF (depth of focus) loss;

FIG. 20 is a cross-sectional view illustrating a step following the step shown in FIG. 16;

FIG. 21 is a cross-sectional view illustrating a step following the step shown in FIG. 20;

DETAILED DESCRIPTION OF THE INVENTION

Figure 5:
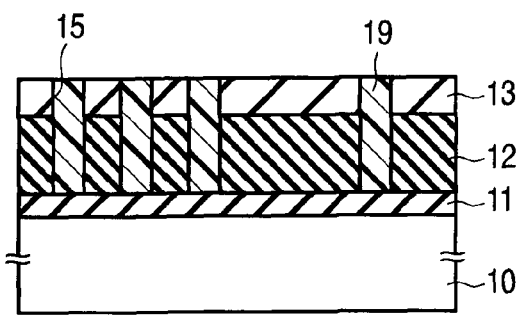
FIG. 5 is a cross-sectional view illustrating a step following the step shown in FIG. 3.

Next, embodiments of the present invention will be explained with reference to the drawings.

It should be appreciated that the present invention should not be construed as being limited to the following embodiments but should be understood to include various modified embodiments that can be carried out without departing from the spirit of the present invention.

In the method of manufacturing a semiconductor device according to one embodiment of the present invention, an organic film is formed on an insulating film having a recess by a solution containing an organic component and a solvent. After the coated film is formed by the coating of the solution, the resultant coated film is subjected to a first baking at a first temperature. This first temperature is controlled to such a level that does not accomplish the cross-linking of the organic component to obtain an organic film precursor through this first baking. Herein, a film where the cross-linking reaction of the organic component thereof is not yet completely accomplished is referred to as an organic film precursor and a film where the solvent contained therein has been removed therefrom is referred to as an organic film. Using a slurry containing resin particles, the organic film precursor is chemically mechanically polished until the insulating film is exposed while remaining the organic film precursor existing in the recess. Subsequently, the organic film precursor left in the recess is subjected to a second baking at a second temperature which is higher than the first temperature. Due to this second baking, the solvent in the organic film precursor is removed to obtain an organic film embedded in the recess.

This recess filled with the organic film may be either a via-hole or a wiring trench. Next, one example of forming the organic film in the via-hole will be explained with reference to FIGS. 1 to 9.

First of all, as shown in FIG. 1, a stopper film 11, a first insulating film 12 and a second insulating film 13 are successively formed on a semiconductor substrate 10 by a CVD method or spin-coating method. As a result, an interlayer insulating film 14 is formed by a combination of the first insulating film 12 and the second insulating film 13. The semiconductor substrate 10 is provided with a semiconductor element and an underlying wiring (both not shown). By lithography and dry etching (RIE), via-holes 15 are formed in the first insulating film 12 and the second insulating film 13. Subsequently, a solution containing an organic component and a solvent is coated on the surface to form a coated film. Then, this coated film is subjected to a first baking at a temperature as explained below to obtain an organic film precursor 16. Moreover, this organic film precursor 16 is subjected to CMP and a second baking at a second temperature to obtain an organic film (first organic film).

On the occasion of forming the coated film by coating the solution on the second insulating film 13 provided with the via-holes 15, this solution is consumed by these via-holes 15. As a result, as shown in FIG. 1, the film thickness of a portion of the coated film which is located at a region where via-holes are densely formed is reduced by a thickness of about 100 nm as compared with the other portion of the coated film which is located at a region where via-holes are sparsely formed or at a field region.

Since the step portion on the surface of the organic film precursor 16 will be reflected to the film(s) to be formed thereon, the surface of the resist film to be formed as a top layer cannot be made planar. Further, the non-uniformity in thickness of the resist film would become a cause for generating a DOF loss in the process of the lithography for forming a pattern of wiring trenches to be performed next to the step for forming the resist film. In this embodiment however, after the formation of a coated film, the baking of the coated film is performed at a specific temperature and the CMP of resist film are performed in such a manner that the film thickness of the resist film to be ultimately obtained becomes uniform, thus ensuring the planarity of the resist film.

It is preferable to employ a resin comprising, as a major component, novolac resin, which is excellent in embedding characteristics, for the formation of the organic film precursor 16. For example, it is possible to employ a resist for i-ray (for example, IX370G, JSR Co., Ltd.) or a resin for forming an anti-reflection layer for ArF excimer laser (for example, ODL-50, JSR Co., Ltd.). It is also possible to employ an organic film comprising, as a major component, cyclohexanone, which is capable of functioning as an anti-reflection layer, in the step of lithography using ArF excimer laser (for example, CT01 and CT08, JSR Co., Ltd.).

The hardness of the film containing an organic component such as novolac resin can be controlled by adjusting the baking temperature thereof. The graph of FIG. 2 illustrates the relationship of them. In this graph, an average hardness (Ave.) of the organic film precursor and the scattering of the hardness (Max–Min) are illustrated.

In this case, the film was formed using novolac resin and the hardness thereof was measured by a hardness-measuring apparatus (Nanoindenter, Kobelco Co., Ltd.). More specifically, the measurement was performed at 15 points within an area of 1 cm×1 cm of the film and an average hardness (Ave.) thereof was determined. The scattering of the hardness was determined by a difference between the maximum value (Max.) and the minimum value (Min.).

Generally speaking, in the case of a film containing an organic component, when the baking temperature thereof is made higher, the crosslinking of polymer is initiated at first, and when the baking temperature is made higher than the crosslinking-finishing temperature thereof, the crosslinking of polymer is accomplished to obtain a film of very high hardness. In the case of the novolac resin employed herein, the crosslinking thereof is initiated at around 150° C. and can be accomplished at around 280° C. As shown in the graph of FIG. 2, when the baking temperature was 300° C., an average hardness of the organic film obtained was 0.5 GPa or so. In this case, although the scattering of the hardness was as small as 0.1 GPa or less, it was impossible to polish the organic film having an average hardness of 0.5 GPa or more by resin particles.

Therefore, in the embodiment of the present invention, the first temperature to be performed in the first baking is required to be regulated so as not to accomplish the cross-linking. For example, in the case of novolac resin, the first temperature should preferably be confined within the range of 90-160° C. As long as the first temperature is confined within this temperature range, the cross-linking cannot be accomplished and, at the same time, it is possible to obtain an organic film precursor which is suited for polishing by resin particles.

In the case of the resist for i-ray where novolac resin is contained as a major component, the resist is dissolved in a solvent such as ethyl lactate, 3-ethoxy ethyl propionate, etc. before using the resist for the formation of a coated film. As described hereinafter, since the solvent is removed during the second baking, the second temperature to be employed in this second baking can be suitably selected depending on the kinds of solvent. For example, in the case where the aforementioned ethyl lactate or 3-ethoxy ethyl propionate is to be employed, the solvent can be removed by heating it at a temperature of about 250° C. For the purpose of reliably removing the solvent and in view of preventing the decomposition of novolac resin, the second temperature should preferably be confined within the range of 250-400° C.

By performing the first baking at the first temperature as described above, the organic film precursor 16 is obtained. Subsequently, part of the organic film precursor 16 that is deposited on the interlayer insulating film 14 is removed to selectively leave the organic film precursor 16 existing in the via-holes 15 as shown in FIG. 3.

The removal of the organic film precursor 16 deposited on the second insulating film 13 is performed by CMP using a slurry containing resin particles. Specifically, a polishing pad made of, for example, IC1000/Suba 400 (Nitta Harth Co., Ltd.) is employed and, as shown in FIG. 4, while rotating a turntable 30 having a polishing pad 31 attached thereon at a speed of 10-70 rpm, a top ring 33 holding a semiconductor substrate 32 is forced to contact with the polishing pad 31 at a polishing load of 10-70 gf/cm$^2$. The rotational speed of the top ring 33 may be set to 20-50 rpm and a slurry 37 is fed from a slurry feed nozzle 35 to the polishing pad 31 at a flow rate of 30-1000 cc/min. Incidentally, FIG. 4 also shows a water feed nozzle 34 and a dresser 36.

The slurry to be employed herein can be fundamentally created by dispersing resin particles in water. Following are detailed explanations about the resin particles.

The resin particles may be particles of a resin selected from the group consisting of acrylic resin such as PMMA (polymethyl methacrylate), PST (polystyrene)-based resin, styrene/acryl copolymer resin, urea resin, melamine resin, polyacetal resin and polycarbonate resin. The resin particles may be constituted by a composite resin. Especially, in viewpoints of hardness and elasticity which are suited for the CMP of the organic film precursor, the employment of PMMA, PST or styrene/acryl copolymer resin is more preferable.

The resin particles may be prepared so as to have a cross-linking structure. When the resin particles are prepared so as to have a cross-linking structure, it becomes possible to enhance the hardness and elasticity of the resin particles, thereby making the resin particles more suitable for the CMP of the organic film precursor. The resin particles having a cross-linking structure can be manufactured by using, as a raw material thereof, a polyfunctional monomer. This polyfunctional monomer is a monomer having two or more polymeric unsaturated bonds, examples of which including, for example, divinyl aromatic compounds, polyvalent(metha) acrylate, etc.

At least one kind of functional group, selected from an anionic functional group, cationic functional group, amphoteric functional group, and nonionic functional group may be introduced into the surface of these resin particles. With respect to the anionic functional group, it is possible to employ a carboxylic acid type, sulfonic acid type, sulfate ester type, or phosphate ester type functional group. With respect to the cationic functional group, it is possible to employ, for example, an amine salt type or quaternary ammonium salt type functional group. With respect to the amphoteric functional group, it is possible to employ, for example, an alkanolamide type, carboxy betaine type or glycine type functional group. With respect to the nonionic functional group, it is possible to employ, for example, an ether type or ester type functional group. Because of the easiness in the manufacture of resin particles, carboxyl group is especially preferable.

In order to stably disperse the resin particles in a solvent, the absolute value of the ζ potential is preferably higher than a certain value of about 20 mV. This magnitude of ζ potential can be achieved by setting the ratio of the functional group to around 0.05 mol/L. Under some circumstances, two or more functional groups may concurrently exist. When these functional groups exist on the surface of resin particles, the dispersibility of the resin particles can be enhanced due to the electric repulsion force among the resin particles, without necessitating the addition of a surfactant.

For example, in the case of the resin particles having, as a functional group, a carboxyl group (COOH) on the surface thereof, the carboxyl group is dissociated in a slurry as represented by: $COOH \rightarrow COO^- + H^+$, thus electrifying the surface of resin particles with a negative charge. Because of this, the aggregation among the resin particles can be prevented due to the electric repulsion force, thereby making it possible to enhance the dispersibility of the resin particles and to prolong the life of the slurry.

Cross-linked PMMA particles having a carboxyl group (COOH) on the surface thereof can be synthesized according to the following procedures. First of all, methyl methacrylate, methacrylic acid, divinyl benzene, ammonium lauryl sulfate and ammonium persulfate are introduced, together with a sufficient amount of ion-exchange water, into a flask. The solution in the flask is heated up to 70-80° C. with stirring in a nitrogen gas atmosphere, thereby allowing polymerization to take place for 6-8 hours. As a result, it is possible to obtain PMMA particles having a carboxyl group on the surface thereof. By suitably modifying the manufacturing conditions such as the quantity of monomer to be used as a raw material, the reaction temperature and time, etc., the average particle diameter of the resin particles can be controlled within the range of 0.01-5 μm.

The average particle diameter of the resin particles can be determined by, for example, TEM observation, SEM observation and measurement of the particle size distribution.

The slurry of this embodiment can be obtained by dispersing the resin particles having any of the aforementioned functional groups on the surface thereof in water. As for the kind of water, it is possible to employ, for example, ion-exchange water or pure water. The resin particles should preferably be dispersed in water in such a manner that the concentration of the resin particles in the slurry would become about 0.01-10 wt %. If the concentration of the resin particles is less than 0.01 wt %, it may become difficult to polish the organic film precursor at a sufficiently high rate. On the other hand, if the concentration of the resin particles is higher than 10 wt %, it may become difficult to secure a sufficient etching selectivity of the organic film relative to an insulating film such as SiN, $SiO_2$ etc. which is formed for burying the organic film. More preferably, the concentration of the resin particles should be confined to 0.1-5 wt %, most preferably 0.3-3 wt %.

If required, additives such as an oxidizing agent, an organic acid and a surfactant may be contained in the slurry at an amount which is generally employed.

The pH of the slurry to be used in this embodiment of the present invention should preferably be confined to the range of 2 to 8. If the pH of the slurry is less than 2, the functional group such as COOH cannot be easily dissociated, thus possibly resulting in the deterioration of dispersibility of the resin particles. On the other hand, if the pH of the slurry is more than 8, chemical damages to the organic film precursor such as a resist film would become prominent, more likely resulting in the increase of dishing.

By suitable incorporation of a pH adjustor, the pH of the slurry can be adjusted to the aforementioned range. As the pH adjustor, it is possible to employ, for example, nitric acid, phosphoric acid, hydrochloric acid, sulfuric acid, citric acid, etc.

In this embodiment, the average particle diameter of the resin particles is desired to be larger than the diameter of the recess in which the organic film is embedded. More specifically, the average particle diameter of the resin particles should preferably be confined within the range of 0.1-5 μm. If the average particle diameter of the resin particles is less than 0.1 μm, the resin particles can easily enter into the recess to be filled with the organic film (in this embodiment, the via-hole formed in the insulating film), more likely resulting in the increase of dishing. On the other hand, if the average particle diameter of the resin particles is larger than 5 μm, it would become difficult to control the dispersibility of the resin particles, more likely resulting in sedimentation of the slurry. More preferably, the average particle diameter of the resin particles should be confined to the range of 0.1-2 μm.

By performing the polishing of the organic film precursor 16 by the aforementioned slurry for a prescribed time period, it would become possible to selectively leave the organic film precursor 16 in the via-hole and to enable the second insulating film 13 to expose as shown in FIG. 3. Furthermore, the dishing of the organic film precursor 16 can be reduced to 20 nm or less and the loss of the second insulating film 13 can be suppressed to approximately zero.

Under the condition where the organic film precursor 16 is left in the via-hole 15 as shown in FIG. 3, the second baking is performed at a second temperature which is higher than the first temperature. As a result of this second baking, the solvent in the organic film precursor 16 can be removed to obtain an organic film (a first organic film) 19 as shown in FIG. 5. As described above, when ethyl lactate or 3-ethoxy ethyl propionate is employed as a solvent for dissolving novolac resin as described above, this second temperature may be set to the range of 250-400° C.

By applying this second baking to the organic film 19 embedded in the via-hole 15 at the second temperature, the solvent contained therein can be removed. Since the solvent does not substantially exist in the organic film 19, even if a film is coated on the organic film 19 in a subsequent step, there is no possibility of the film being damaged in surface planarity. It is impossible to form a coated film having a planar surface on the organic film precursor containing solvent. The solvent remaining in the planarized organic film precursor reacts with the solvent in a coated film, thereby damaging the planarity of the planarized organic film precursor. As a result, step portions generate on the surface of the coated film.

Figure 6:
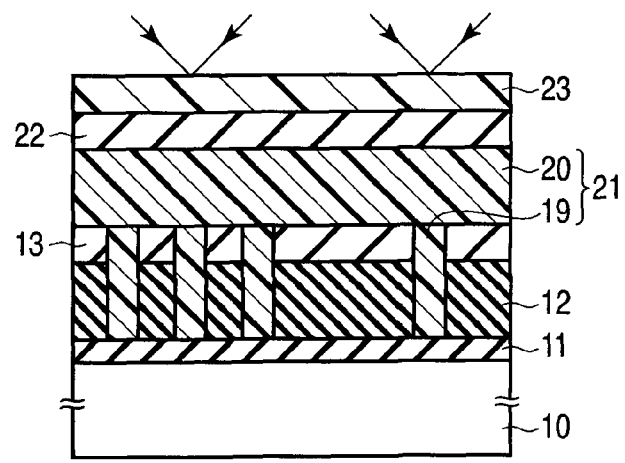
FIG. 6 is a cross-sectional view illustrating a step following the step shown in FIG. 5.

In the case of this embodiment however, since the organic film 19 embedded in the via-hole 15 is substantially free from any solvent, the aforementioned problem can be obviated. Namely, as shown in FIG. 6, the second organic film 20 can be formed on the first organic film 19 with the surface planarity of the second organic film 20 being sufficiently secured. An underlying film 21 is constituted by a combination of the first organic film 19 and the second organic film 20 deposited on the first organic film 19.

After the coating of a film serving as the second organic film 20 on the first organic film 19, the resultant underlying film 21 should preferably be baked at a temperature of not less than 250° C. (a third baking) prior to the deposition of an intermediate layer 22 on the second organic film 20. This third baking is effective in enhancing the etching resistance of the underlying film 21. If the temperature of this third baking is too high, the organic components contained in the first organic film 19 and the second organic film 20 may decompose. Therefore, the temperature of the third baking should preferably be limited at most to 400° C. or so.

As shown in FIG. 6, the intermediate layer 22 and a resist film 23 are successively deposited on the underlying film 21. Since the surface of the underlying film 21 is planar, the surface of the resist film 23 to be deposited on the underlying film 21 can be made planar. Since the generation of step portions can be inhibited irrespective of the density of via-holes, the patterning exposure of the resist film 23 can be performed without the exposure dependency (best focusing) of the resist film being made substantially dependant on the via-hole density. As a result, it is now possible to enlarge the focus margin of lithography.

Figure 7:
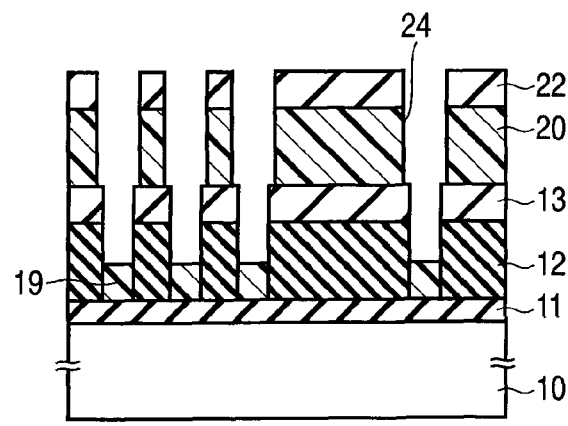
FIG. 7 is a cross-sectional view illustrating a step following the step shown in FIG. 6.

The resist film 23 that has been subjected to the patterning exposure is then subjected to development using a developing solution to obtain a resist pattern (not shown). Using this resist pattern as an etching mask, the intermediate layer 22 and the second organic film 20 are successively subjected to etching to create a wiring trench pattern 24 as shown in FIG. 7. In this etching step, the resist film 23 is removed, the second insulating film 13 is pierced, and, for the purpose of transcribing the wiring trench pattern 24 down to an intermediate portion of the first insulating film 12, the intermediate layer 22 is also removed.

Figure 8:
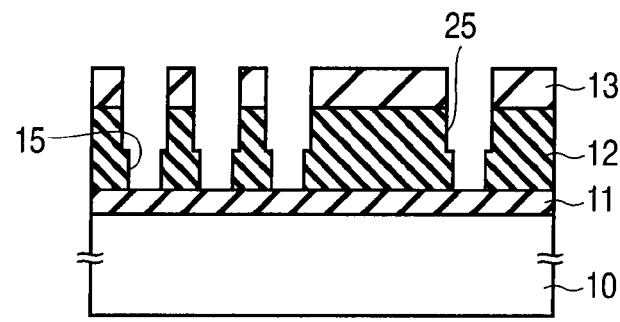
FIG. 8 is a cross-sectional view illustrating a step following the step shown in FIG. 7.
Figure 9:
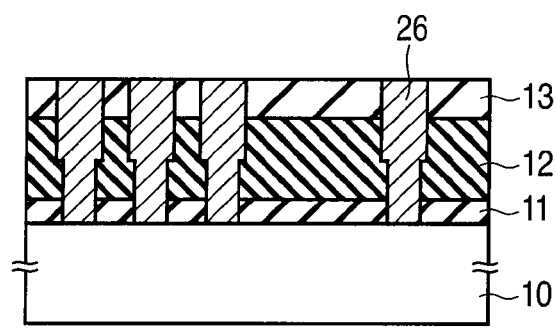
FIG. 9 is a cross-sectional view illustrating a step following the step shown in FIG. 8.

Subsequently, the first organic film 19 embedded in the via-holes 15 is peeled away together with the second organic film 20 deposited on the second insulating film 13, thereby forming wiring trenches 25 communicated with the via-holes 15 as shown in FIG. 8. Thereafter, a stopper film 11 located inside the via-holes is removed and then a Cu film is deposited, via a barrier metal film (not shown) made of TaN, etc., on the surface by plating or sputtering. The resultant surface is then subjected to CMP to remove the Cu that is located on the field region, thereby creating a Cu dual damascene wiring 26 as shown in FIG. 9.

As another embodiment of the present invention, an organic film may be embedded in a wiring trench pattern constituted by recesses. One example of forming an organic film in the wiring trench pattern will be explained with reference to FIGS. 10-25.

Figure 10:
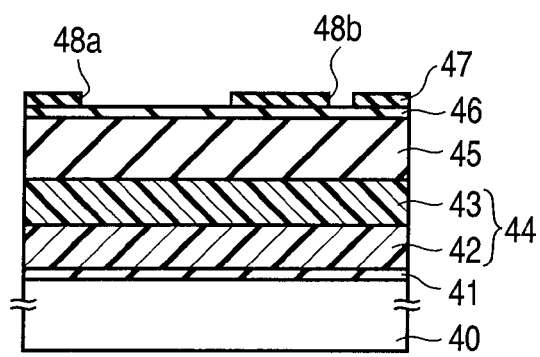
FIG. 10 is a cross-sectional view illustrating one step in the method of manufacturing a semiconductor device according to another embodiment.

First of all, as shown in FIG. 10, an organic insulating film 44, and a first, a second and a third hard masks 45, 46 and 47 each containing an inorganic material are successively deposited on a semiconductor substrate 40 having semiconductor elements (not shown) formed therein and then wiring trench patterns 48a and 48b both constituted by recesses are formed in the third hard mask 47. In this embodiment, the organic insulating film 44 is constituted by a 2-ply structure consisting of a first organic insulating film 42 and a second insulating film 43. An etching stopper film 41 is formed under the organic insulating film 44.

Although not shown in FIG. 10, an interlayer insulating film having a first wiring layer embedded therein is interposed between the etching stopper film 41 and the semiconductor substrate 40. As the interlayer insulating film, it is possible to employ, for example, a silicon oxide film wherein a Cu wiring is embedded through a barrier layer, thereby forming the first wiring layer. The etching stopper film 41 also acts to prevent the diffusion of Cu and can be created by the deposition of an SiN film for example.

The first organic insulating film 42 and the second insulating film 43 can be formed by depositing SiOC and PAE (polyaryl ether), respectively, by PE-CVD (Plasma Enhancement Chemical Vapor Deposition) method. With respect to the raw materials for the organic film, it is also possible to employ polyaryl ether (FLARE: trade name; Allied Signal Co., Ltd.; SILK: trade name; Dow Chemicals Co., Ltd.), benzocyclobutene (Dow Chemicals Co., Ltd.), polyimide, etc. With respect to the film thickness of the first and the second insulating films 42 and 43, there is no particular limitation, and the film thickness can be selected from the range of 50-400 nm.

With respect to the raw materials for the organic film to be formed by CVD, there have been known various materials, such as Choral (trade name; Nobelas Co., Ltd.), Aurora (trade name; ASM Co., Ltd.), Black Diamond (trade name; Applied Materials Co., Ltd.), etc. With respect to the raw materials for the organic film to be formed by coating, there have been known various materials, such as methylsilsesquioxane, etc.

Then, a silane-based $SiO_2$ film is deposited as a first hard mask 45 on the organic insulating film 44 which consists of the first and the second organic insulating films 42 and 43 by CVD or PVD (Physical Vapor Deposition). As the second hard mask 46, it is possible to employ, for example, an SiN film. As the third hard mask 47, it is possible to employ an $SiO_2$ film formed using, for example, TEOS (tetraethoxy silane). The first, the second and the third masks 45, 46 and 47 may be formed by any of these materials. Further, these hard masks may be formed by a silicon carbide film.

After a resist pattern (not shown) is formed on the third hard mask 47, this third hard mask 47 is subjected to dry etching by $C_4F_8$/CO/Ar gas, thereby forming the wiring trench patterns 48a and 48b, both constituted by recesses in the third hard mask 47, as shown in FIG. 10. The width of the wiring trench pattern 48a may be 3 μm and the width of the wiring trench pattern 48b may be 0.4 μm.

As shown in FIG. 11, an organic film precursor 49 is formed on the third hard mask 47 having the wiring trench patterns 48a and 48b formed therein. This organic film precursor 49 contacts, at the underlying surface thereof, with the second hard mask 46 made of SiN. On the occasion of forming the organic film precursor 49, a resist containing novolac resin as a major component (IX370G; JSR Co., Ltd.) is coated to form a coated film having a film thickness of 0.1-3 μm or so.

As already explained above, since the crosslinking reaction of novolac resin can be accomplished at a temperature of about 250° C., the first baking is performed at a temperature (the first temperature) lower than 250° C. to obtain the organic film precursor 49.

As shown in FIG. 11, a step portion 50 reflecting the wiring trench pattern 48a generates on the surface of the organic film precursor 49. In this embodiment, the organic film precursor 49 is left in the wiring trench patterns 48a and 48b by CMP and then the second baking is performed at the second temperature which is higher than the first temperature. Subsequently, an organic film is again deposited by coating to form an underlying film, thereby inhibiting the DOF loss. An organic film comprising, as a major component, novolac resin is more preferable as compared with an organic film comprising, as a major component, cyclohexanone, for instance, in terms of facilitating the planarization of the surface. Furthermore, the organic film comprising, as a major component, novolac resin is higher in the adhesive force thereof to the third hard mask 47 as compared with the organic film comprising, as a major component, cyclohexanone, and hence the possibility of generating the peeling of the organic film on the occasion of CMP can be comparatively minimized.

The planarization of the organic film precursor 49 can be performed by CMP using a slurry containing resin particles and a water-soluble polymer. Fundamentally, the planarization of the organic film precursor 49 can be performed according to the method explained above with reference to FIG. 4. By conducting the polishing for a predetermined period of time, the organic film precursor 49 can be left in the wiring trench patterns 48a and 48b as shown in FIG. 12 and the third hard mask 47 is enabled to expose. Additionally, the dishing to be formed on the surface of the organic film precursor 49 after polishing can be suppressed to 10 nm or less.

The slurry to be employed in the planarizing of the organic film precursor 49 may be fundamentally the same as that described above. In this case however, it is more preferable for the slurry to further contain a water-soluble polymer.

However, the average particle diameter of the resin particles to be used herein should preferably be confined to the range of 0.01-5 μm. When the slurry is formulated to contain a water-soluble polymer in this embodiment, it becomes possible to employ resin particles which are smaller in size as compared with the case where an organic film is embedded in the via-holes. When the average particle diameter of the resin particles is larger than 5 μm or smaller than 0.01 μm, it becomes difficult to control the dispersibility of resin particles, more likely resulting in the sedimentation of the slurry. More preferably, the average particle diameter of the resin particles should be confined to the range of 0.03-0.5 μm. The resin particles of these sizes can be synthesized by the above-described method and by suitably modifying the quantity of monomer to be used as a raw material, reaction temperature and time, and other manufacturing conditions.

With respect to the concentration of the resin particles in the slurry, it should preferably be confined to about 0.01-10 wt %. If the concentration of the resin particles is less than 0.01 wt %, the polishing rate may be decreased extremely. On the other hand, if the concentration of the resin particles is higher than 10 wt %, it may become difficult to confine the magnitude of dishing to an acceptable range. More preferably, the concentration of the resin particles should be confined to 0.1-5 wt %, most preferably 0.3-3 wt %.

The dimension of the wiring trench pattern constituted by recesses is generally confined to several micrometers and hence larger than the size of the resin particles. Accordingly, resin particles may enter into the wiring trench pattern to enlarge the dishing on the occasion of planarizing the organic film precursor that has been formed on the insulating film having these recesses. As a result, it may become impossible to secure the surface planarity, thus giving rise to the occurrence of DOF loss in the following lithography process for forming a pattern of holes.

It may be conceivable to increase the hardness of the organic film precursor to be polished in order to inhibit the magnitude of dishing. However, since the resin particles to be used in the polishing in this embodiment are very soft and relatively poor in polishing action, they cannot be used for polishing a film of high hardness. Since the temperature of the first baking to be performed prior to the CMP is regulated to such a low temperature that cannot accomplish the cross-linking of the organic component, a high-temperature baking cannot be employed herein.

In this embodiment, the inhibition of the dishing can be made possible through the incorporation of a water-soluble polymer in the slurry. This water-soluble polymer is capable of adsorbing onto the surface of the organic film precursor to be polished and hence is effective in protecting the organic film precursor from the action of the resin particles. The mechanism of the effects of this water-soluble polymer will be discussed hereinafter.

Examples of the water-soluble polymer include, for example, celluloses such as methyl cellulose, methyl hydroxyethyl cellulose, methyl hydroxypropyl cellulose, hydroxyethyl cellulose, hydroxypropyl cellulose, carboxymethyl cellulose, carboxyethyl cellulose, carboxymethyl hydroxyethyl cellulose, etc.; polysaccharides such as chitosan, etc.; polyethylene glycol; polyethylene imine; polyvinylpyrrolidone; polyvinyl alcohol; polyacrylic acid and salts thereof; polyacryl amide; polyethylene oxide; etc. These water-soluble polymers may be employed singly or in combination of two or more kinds.

Among these water-soluble polymers, polyvinyl alcohol and polyvinylpyrrolidone are more preferable in terms of realizing excellent planarity.

Preferably, the water-soluble polymer should be selected from those having an average molecular weight of 500-1,000,000. If the average molecular weight of the water-soluble polymer is less than 500, it may be impossible to secure a sufficient interaction to the organic film precursor to be polished, and the effects of the water-soluble polymer to protect the organic film precursor would be reduced, thereby making it difficult to inhibit the dishing. On the other hand, if the average molecular weight of the water-soluble polymer is larger than 1,000,000, the effects of adsorption thereof to the organic film precursor would become excessive, thus possibly resulting in the decrease of the polishing rate. Additionally, the viscosity of the slurry may become too high, thus possibly making it difficult to feed the slurry. Therefore, the average molecular weight of the water-soluble polymer should preferably be confined to the range of 1,000-500,000, more preferably 5,000-300,000.

With respect to the concentration of the water-soluble polymer in the slurry, it should preferably be confined to the range of 0.001-10 wt %. If the concentration of the water-soluble polymer is less than 0.001 wt %, it may become difficult to inhibit the dishing. On the other hand, if the concentration of the water-soluble polymer is higher than 10 wt %, the water-soluble polymer may excessively adsorb onto the organic film precursor, thus possibly extremely decreasing the polishing rate. More preferably, the concentration of the water-soluble polymer should be confined to 0.01-1 wt %, most preferably 0.05-0.5 wt %.

Since the polishing is performed using a slurry containing a water-soluble polymer and resin particles as described above, the dishing of the resist film to the wiring trench pattern can be suppressed to 20 nm or less, thus remarkably improving the planarity. The reason for this can be attributed to the existence of the water-soluble polymer in the slurry as explained below.

In the case where the CMP of the organic film precursor is performed using a slurry containing the resin particles without the inclusion of the water-soluble polymer, the polishing goes on while peeling the organic film precursor due to the effects of high friction. Whereas, as shown in FIG. 13, in the case of the slurry containing not only a resin particles 60 but also a water-soluble polymer 61, the water-soluble polymer 61 acts like a lubricating oil between a wafer and a polishing pad 31, thereby alleviating the friction and hence realizing a polishing mechanism wherein the organic film precursor 49 can be gradually removed. In addition to this, the water-soluble polymer is enabled to adsorb onto the surface of the organic film precursor 49, thereby protecting the surface of the organic film precursor 49 from the action of the resin particles. As a result, due to the employment of the slurry comprising the water-soluble polymer 61 in addition to the resin particles 60, it is now possible to secure planarity and, at the same time, to inhibit the generation of scratches owing to the softness of the resin particles 60.

Furthermore, since the material to be employed as an abrasive grain is formed of resin particles having almost the same characteristics as those of the organic film precursor, even if the resin particles are left behind after the CMP, there is no possibility of the resin particles being turned into an etching mask in the subsequent working processes as seen in the case of alumina particles. For this reason, it is possible to minimize the risk resulting from the residual particles. As a result, it is possible to minimize the DOF loss in the lithography for forming via-holes in a subsequent step, thus making it possible to remarkably enhance the yield.

Incidentally, when the polishing is performed using a slurry comprising only a water-soluble polymer, the polishing rate would become very slow even though it may be possible to confine the dishing to 20 nm or less due to the polishing mechanism as described above. Therefore, in order to secure a practical polishing rate on the occasion of embedding the organic film in the wiring trench pattern constituted by recesses, it is necessary to employ a slurry containing resin particles and water-soluble polymer.

The polishing of the organic film precursor 49 may be performed in two steps using different kinds of slurries. Namely, in the first polishing step, a first slurry is employed to planarize the organic film precursor 49 as shown in FIG. 14. Then, in the second polishing step using a second slurry, the third hard mask 47 is enabled to expose as shown in FIG. 12.

This second slurry may be of the same composition as that of the first slurry except that the concentration of the resin particles and/or the water-soluble polymer is changed. In this case, the quantity of the resin particles to be contained in the second slurry should be made smaller than that in the first slurry and the quantity of the water-soluble polymer to be contained in the second slurry should be made larger than that in the first slurry. In order to secure a sufficiently large polishing rate while completely inhibiting the dishing, the concentration of the resin particles should desirably be changed concurrently with the concentration of the water-soluble polymer.

For example, when the concentration of the resin particles in the first slurry is set to 0.6-1 wt %, the concentration of the resin particles in the second slurry is set to 0.1-0.5 wt %. Additionally, the concentration of the water-soluble polymer in the first slurry is set to 0.01-0.2 wt %, and the concentration of the water-soluble polymer in the second slurry is set to 0.25-0.5 wt %.

Using the first and the second slurries differing in composition as described above, it is possible to achieve planarizing with a sufficiently large polishing rate in the first polishing while avoiding the generation of defects such as the enlargement of dishing and, at the same time, to inhibit the additional generation of dishing in the second polishing.

Then, the second baking is performed at a second temperature which is higher than that of the first temperature to remove the solvent from the organic film precursor 49 and to accomplish the cross-linking of the organic film precursor 49, thereby obtaining an organic film (a first organic film) 51 embedded in the wiring trench patterns 48a and 48b as shown in FIG. 15.

Then, IX370G is coated again to form a second organic film 52 as shown in FIG. 16 to obtain an underlying film 53 including the organic film 51 and the second organic film 52. Due to the reasons as described above, it is desirable to bake the underlying film 53 at a temperature of 250-400° C. or so prior to the formation of an intermediate layer 54. Then, an SOG (Spin On Glass) film as the intermediate layer 54 and a resist film 55 are successively deposited. Herein, the second organic film 52 may be deposited at a thickness of 300 nm or so. Further, the thickness of the intermediate layer 54 and of the resist film 55 may be about 100 nm and about 200 nm, respectively.

Since the surface of the underlying film 53 is planar, the surface of the resist film 55 formed thereon would also become planar. The formation of the underlying film 53 having a planar surface is made possible since the second organic film 52 is deposited on the organic film 51 containing no solvent.

Figure 17:
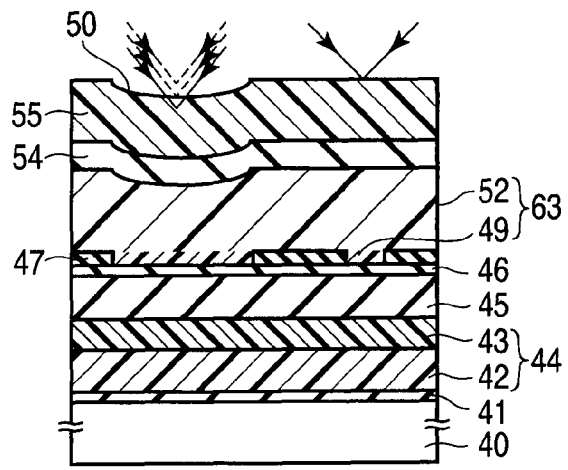
FIG. 17 is a cross-sectional view schematically illustrating a laminate structure to be obtained when the second baking is not executed.

FIG. 17 illustrates one example wherein a second organic film, etc. are formed without executing the second baking after the organic film precursor 49 has been selectively left in the wiring trench pattern as shown in FIG. 12. As shown in FIG. 17, when the second organic film 52 is deposited on the organic film precursor 49, step portions generate on the surface of underlying film 63 including the organic film precursor 49 and the second organic film 52. Even if the surface of the organic film precursor 49 is planarized by CMP, the effects to be derived therefrom would vanish, so that the step portions that have been created on the surface of the underlying film 63 would be reflected to the surface of the resist film 55 formed as an uppermost layer.

Namely, since the organic film precursor 49 is baked at a temperature which cannot accomplish the cross-linking of the organic component prior to the step of CMP, the solvent in the organic film precursor 49 cannot be sufficiently removed therefrom under this baking condition. The solvent that has been left in the organic film precursor 49 without being sufficiently removed therefrom is assumably enabled to react with the solvent in the second organic film 52 to dissolve the organic film precursor 49, resulting in the creation of step portions on the surface of the underlying film 63.

Figure 18A:
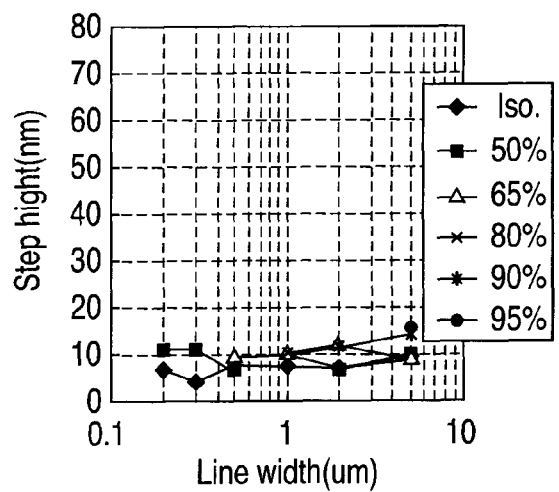
FIGS. 18A and 18B are graphs both illustrating the relationship between the line width and the step height.
Figure 18B:
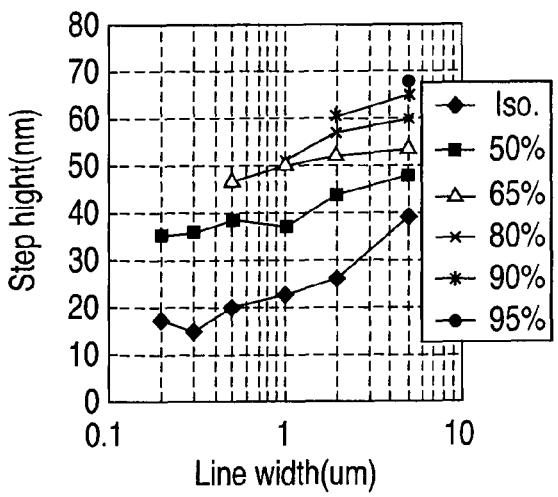

FIGS. 18A and 18B illustrate the relationship between the wiring line width and the height of the step portions formed on the surface of resist film. FIG. 18A represents the structure according to this embodiment wherein the solvent was removed through the second baking. FIG. 18B represents a case wherein the second baking was not undertaken so that the solvent was permitted to remain in the first organic film. In FIGS. 18A and 18B, Iso. represents an isolated pattern and the percentages 50%, 65%, 80%, 90% and 95% represent the coverage of wiring. The coverage of wiring means a value that can be derived by dividing the wiring line by a total value of the wiring line width and the space width. The isolated pattern refers to the case where the space width is infinity.

As shown in FIG. 18A, in the case of this embodiment, irrespective of the wiring line width and the coverage of wiring, the height of the step portions was inhibited to 20 nm or less. Whereas, in the case where the solvent remain in the first organic film, the height of the step portions increase as the wiring line width was increased, as can be seen from FIG. 18B. In the case where the coverage of the wiring was also large, the height of the step portions was shown to increase. Therefore, in the situations where wirings differing in width exist or where the wirings are formed with different coverages, it is difficult to inhibit the magnitude of the step portion.

The step portions on the surface of the resist film 55 may lead to an increase in DOF loss. As shown in FIG. 16, after the resist film 55 has been formed, the resist film 55 is subjected, through an exposure mask provided with a hole pattern, to exposure by a KrF excimer laser. The diameter of the hole pattern may be, for example, about 60 nm. As explained above with reference to FIG. 18A, since the magnitude of step portion can be suppressed irrespective of the wiring line width, the DOF loss on the occasion of forming via-holes over a wiring having a line width of 3 μm as well as a line width of 0.4 μm can be confined to 10 nm or less.

The graph of FIG. 19 illustrates the relationship between the wiring line width and the DOF loss. The results obtained in this embodiment are represented by a solid line "a", which indicates that the DOF loss is approximately uniform irrespective of the wiring line width. Because of this, it is now possible to remarkably improve the non-uniformity in a dimension of the hole pattern and, furthermore, to remarkably enhance the yield. Incidentally, the dotted line "b" in FIG. 19 represents the results obtained from the structure shown in FIG. 17, indicating that the DOF loss increase as the wiring line width was enlarged.

The resist film 55 that has been subjected to the exposure is then developed by a developing solution to obtain a resist pattern (not shown). Then, by this resist pattern as an etching mask, the intermediate layer 54 is worked using $CHF_3/O_2$ gas. Furthermore, the underlying film 53 is worked using $NH_3/O_2/CH_4$ gas and then the resist pattern is peeled off by $O_2$ ashing.

Using the patterned intermediate layer 54 and the patterned underlying film 53 as a mask, a connecting hole (via-hole) is created in the second hard mask 46 as well as in the first hard mask 45 by dry-etching. As the etching gas to be used in this case, it is possible to employ $CHF_3/Ar/O_2$ gas. During the working of the first hard mask 45, the intermediate layer 54 is removed. Furthermore, the resultant body is subjected to dry etching using $NH_3$ gas to form connecting holes 56 in the second organic insulating film 43, as shown in FIG. 20. FIG. 20 shows part of the broad wiring pattern shown in FIG. 11. The figures subsequent to FIG. 20 also show part of the broad wiring trench pattern shown in FIG. 11. It should be noted that the underlying film 53 is removed on the occasion of working the second organic insulating film 43.

Figure 22:
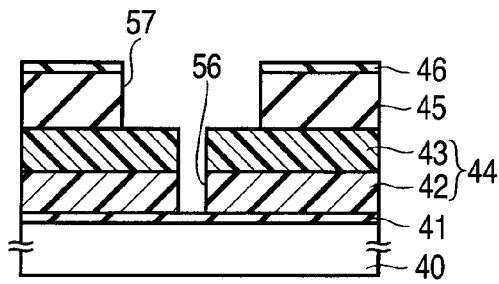
FIG. 22 is a cross-sectional view illustrating a step following the step shown in FIG. 21.

Then, using $CH_2F_2/CF_4/Ar/O_2$ gas, the resultant body is dry-etched to form a wiring trench pattern 48 in the second hard mask 46 as shown in FIG. 21. As shown in FIG. 21, at this moment, the connecting hole 56 is dug down to an intermediate portion of the first organic insulating film 42. Furthermore, using $C_5F_8/Ar/O_2$ gas, the third hard mask 47 is removed and, at the same time, a wiring trench 57 is formed in the first hard mask 45 as shown in FIG. 22. At this moment, the connecting hole 56 is dug down to reach the etching stopper film 41. By this two-stage working process as explained above, the connecting hole 56 can be formed in the first organic insulating film 42. This working process is advantageous in the respect that the connecting hole 56 can be reliably formed so as to pierce through the first organic insulating film 42.

Figure 23:
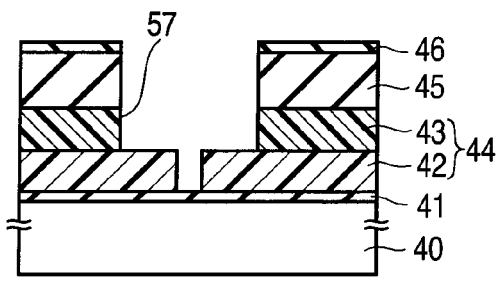
FIG. 23 is a cross-sectional view illustrating a step following the step shown in FIG. 22.
Figure 24:
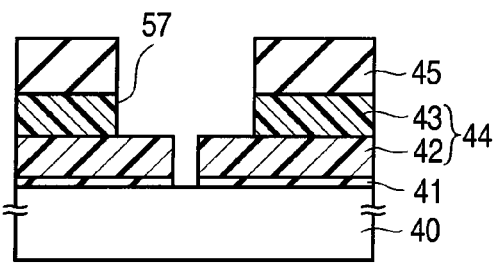
FIG. 24 is a cross-sectional view illustrating a step following the step shown in FIG. 23.

Then, by dry etching using $NH_3$ gas, a wiring trench 57 is formed in the second organic insulating film 43 as shown in FIG. 23. Finally, using $CH_2F_2/CF_4/Ar/O_2$ gas, the second hard mask 46 is removed as shown in FIG. 24. At this moment, the etching stopper film 41 existing at the bottom portion of the connecting hole 56 is also removed.

Figure 25:
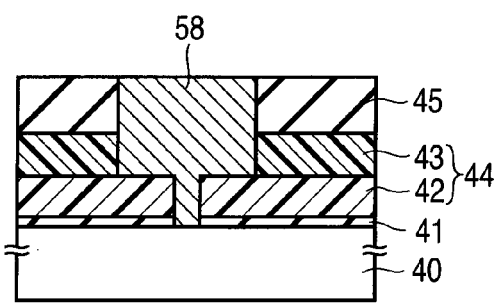
FIG. 25 is a cross-sectional view illustrating a step following the step shown in FIG. 24.

Subsequently, a barrier layer (not shown) is formed on the inner surface of the recesses including the connecting hole 56 and the wiring trench 57 and then the recesses are filled with Cu. Then, redundant portions of Cu film and barrier layer, which are deposited on a silicon oxide film constituting the first hard mask 45, are removed. As a result, a Cu damascene wiring can be formed in the recesses as shown in FIG. 25, thus creating a hybrid dual damascene wiring 58.

In this embodiment, the organic film precursor 49 is planarized by CMP on the occasion of forming a multi-layer through the deposition of the second organic film 52 on the first organic film 51. Moreover, since the organic film precursor 49 is baked at the second temperature after the CMP so as to substantially remove the solvent from the organic film precursor 49, there is no possibility that the planarity of the surface can be damaged by a coated film to be formed thereon. Therefore, the DOF loss that may occur on the occasion of exposure can be inhibited to 10 nm or less and hence it is now possible to remarkably improve the non-uniformity in a dimension of the hole pattern and, furthermore, to remarkably enhance the yield.

Next, embodiments of the present invention will be explained with reference to specific examples. First of all, slurries having the following features were prepared.

(Slurry 1)

92 parts by weight of styrene, 4 parts by weight of methacrylic acid, 4 parts by weight of hydroxyethyl acrylate, 0.1 part by weight of ammonium lauryl sulfate, 0.5 part by weight of ammonium persulfate and 400 parts by weight of ion-exchange water were introduced into a 2 L flask. The resultant solution in the flask was heated up to 70° C. with stirring in a nitrogen gas atmosphere, thereby allowing polymerization to take place for 6 hours. As a result, it was possible to obtain PST particles having a carboxyl group on the surface thereof and an average particle diameter of 200 nm.

Then, the PST particles were dispersed in pure water at a concentration of 0.83 wt % to obtain Slurry 1.

(Slurry 2)

PST particles having an average particle diameter of 100 nm were dispersed in pure water at a concentration of 0.83 wt % to obtain Slurry 2.

(Slurry 3)

77 parts by weight of styrene, 3 parts by weight of acrylic acid, 20 parts by weight of divinyl benzene, 2.0 parts by weight of ammonium dodecylbenzene sulfonate, 1.0 part by weight of ammonium persulfate and 400 parts by weight of ion-exchange water were introduced into a 2 L flask. The resultant solution in the flask was heated up to 70° C. with stirring in a nitrogen gas atmosphere, thereby allowing polymerization to take place for 6 hours. As a result, it was possible to obtain PST particles having carboxyl group on the surface thereof and an average particle diameter of 100 nm.

Then, the cross-linked PST particles were dispersed in pure water at a concentration of 0.83 wt % to obtain Slurry 3.

(Slurry 4)

The cross-linked PST particles having an average particle diameter of 200 nm were dispersed in pure water at a concentration of 0.83 wt % to obtain Slurry 4.

(Slurry 5)

Polyvinyl alcohol having a molecular weight of 17600 was added as a water-soluble polymer to the Slurry 1 to obtain Slurry 5.

(Slurry 6)

PST particles having an average particle diameter of 50 nm were dispersed in pure water at a concentration of 0.83 wt % to obtain a dispersion to which poly(vinyl pyrrolidone) having a molecular weight of 120000 was added as a water-soluble polymer at a concentration of 0.16 wt % to obtain Slurry 6.

(Slurry 7)

Cross-linked PST particles having an average particle diameter of 50 nm were dispersed in pure water at a concentration of 0.83 wt % to obtain a dispersion to which polyvinyl alcohol having a molecular weight of 17600 was added as a water-soluble polymer at a concentration of 0.16 wt % to obtain Slurry 7.

(Slurry 8)

Poly(vinyl pyrrolidone) having a molecular weight of 120000 was added as a water-soluble polymer to Slurry 4 at a concentration of 0.16 wt % to obtain Slurry 8.

(Slurry 9)

Slurry 9 was obtained under the same conditions as employed in obtaining Slurry 5 except that the concentration of the PST particles was reduced to 0.36 wt % and the concentration of polyvinyl alcohol employed as a water-soluble polymer was increased to 0.33 wt %.

(Slurry 10)

Alumina particles having a primary particle diameter of 50 nm were dispersed in pure water at a concentration of 1.0 wt % to obtain Slurry 10.

Using the slurries obtained as describe above, the polishing of the organic film precursor was performed in accordance with the method of the embodiment of the present invention.

First of all, an organic film precursor 16 was formed on the interlayer insulating film 14 provided with via-holes 15 as shown in FIG. 1. Then, the first baking, the CMP and the second baking were applied to the organic film precursor 16, thereby creating the organic film 19 in the via-holes 15 as shown in FIG. 5. The kinds of films for the organic film precursor 16, the temperature of the first baking, the slurries employed in the CMP, and the temperature of the second baking are summarized in the following Table 1. Further, the polishing rate of the organic film precursor 16 was determined according to a conventional method.

TABLE 1

|  | Underlying film | First baking temperature | Slurry | Second baking temperature |
| --- | --- | --- | --- | --- |
| Example 1 | IX370G | 130° C. | 1 | 300° C. |
| Example 2 | ODL-50 | 150° C. | 1 | 300° C. |
| Example 3 | IX370G | 130° C. | 2 | 300° C. |
| Example 4 | ODL-50 | 150° C. | 2 | 300° C. |
| Example 5 | IX370G | 130° C. | 3 | 300° C. |
| Example 6 | ODL-50 | 150° C. | 3 | 300° C. |
| Example 7 | IX370G | 130° C. | 4 | 300° C. |
| Example 8 | ODL-50 | 150° C. | 4 | 300° C. |

The second organic film 20 was deposited on the second insulating film 13 having the organic film 19 embedded therein as shown in FIG. 6 and then the non-uniformity in film thickness of the second organic film 20 was determined according to a conventional method. Subsequently, the intermediate layer 22 and the resist film 23 were successively deposited on the second organic film 20 and then the patterning of the resist film 23 was performed.

For the purpose of comparison, the organic film precursor 16 (organic film) was embedded under the conditions shown in the following Table 2 and the polishing rate of the organic film precursor 16 (organic film) was determined according to a conventional method.

TABLE 2

|  | Underlying film | First baking temperature | Slurry | Second baking temperature |
| --- | --- | --- | --- | --- |
| Com. Ex. 1 | IX370G | 130° C. | 1 | None |
| Com. Ex. 2 | ODL-50 | 150° C. | 1 | None |
| Com. Ex. 3 | IX370G | 130° C. | 2 | None |
| Com. Ex. 4 | ODL-50 | 150° C. | 2 | None |
| Com. Ex. 5 | IX370G | 130° C. | 3 | None |
| Com. Ex. 6 | ODL-50 | 150° C. | 3 | None |
| Com. Ex. 7 | IX370G | 130° C. | 4 | None |
| Com. Ex. 8 | ODL-50 | 150° C. | 4 | None |
| Com. Ex. 9 | IX370G | 130° C. | 10 | None |
| Com. Ex. 10 | ODL-50 | 300° C. | 10 | None |

In the same manner as conducted in the cases of above Examples, the second organic film 20, the intermediate layer 22 and the resist film 23 were successively deposited on the second insulating film 13 having the organic film precursor 16 embedded therein and then the patterning of the resist film 23 was performed. Then, according to a conventional method, the non-uniformity in film thickness of the second organic film 20 was determined.

The polishing rate of the organic film precursor 16 and the non-uniformity in film thickness of the second organic film 20 are summarized in the following Table 3.

TABLE 3

|  | Polishing rate (nm/min) | Non-uniformity in film thickness |
| --- | --- | --- |
| Example 1 | 1000 | <20 nm |
| Example 2 | 2000 | <20 nm |
| Example 3 | 1000 | <20 nm |
| Example 4 | 500 | <20 nm |
| Example 5 | 2000 | <20 nm |
| Example 6 | 800 | <20 nm |
| Example 7 | 1000 | <20 nm |
| Example 8 | 1000 | <20 nm |
| Com. Ex. 1 | 1000 | >50 nm |
| Com. Ex. 2 | 2000 | >50 nm |
| Com. Ex. 3 | 1000 | >50 nm |
| Com. Ex. 4 | 500 | >50 nm |
| Com. Ex. 5 | 2000 | >50 nm |
| Com. Ex. 6 | 800 | >50 nm |
| Com. Ex. 7 | 1000 | >50 nm |
| Com. Ex. 8 | 1000 | >50 nm |
| Com. Ex. 9 | 1000 | >50 nm |
| Com. Ex. 10 | 100 | <20 nm |

In the case of Examples, since the first baking, the CMP and the second baking were performed in the process of embedding the organic film in the recesses, the non-uniformity in film thickness of the second organic film 20 was minimized to less than 20 nm, as indicated in the above Table 3, thus making it possible to improve the surface planarity.

Whereas, as indicated by the results of Comparative Examples, when the second baking was omitted after the step of CMP, the non-uniformity in film thickness of the second organic film 20 was increased by more than 50 nm, thus deteriorating the surface planarity. Incidentally, when a slurry containing alumina particles was employed, it was impossible to obtain desirable results irrespective of the baking temperature. As in the case of Comparative Example 9, when the temperature of the first baking is too low, it was impossible to minimize the non-uniformity in film thickness of the second organic film 20. Further, as in the case of Comparative Example 10, when the temperature of the first baking is too high, the organic film was already created at that moment, thus making it impossible to polish the organic film at a practical polishing rate.

In view of above results, it was demonstrated that the employment of the method according to this embodiment was effective in improving the surface planarity of the resist film and to enlarge the focus margin in the lithography.

Next, as shown in FIG. 11, the organic film precursor 49 was formed on the third hard mask 47 provided with the wiring trench patterns 48a and 48b. Then, the first baking, the CMP and the second baking were applied to the organic film precursor 49, thereby creating the organic film 51 in the wiring trench patterns 48a and 48b as shown in FIG. 15. The kinds of films for the organic film precursor 49, the temperature of the first baking, the slurries employed in the CMP, and the temperature of the second baking are summarized in the following Table 4.

TABLE 4

|  | Underlying film | First baking temperature | Slurry | Second baking temperature |
| --- | --- | --- | --- | --- |
| Example 9 | IX370G | 130° C. | 5 | 300° C. |
| Example 10 | ODL-50 | 150° C. | 5 | 300° C. |

TABLE 4-continued

|  | Underlying film | First baking temperature | Slurry | Second baking temperature |
|---|---|---|---|---|
| Example 11 | IX370G | 130° C. | 6 | 300° C. |
| Example 12 | ODL-50 | 150° C. | 6 | 300° C. |
| Example 13 | IX370G | 130° C. | 7 | 300° C. |
| Example 14 | ODL-50 | 150° C. | 7 | 300° C. |
| Example 15 | IX370G | 130° C. | 8 | 300° C. |
| Example 16 | ODL-50 | 150° C. | 8 | 300° C. |
| Example 17 | IX370G | 130° C. | 5, 9 | 300° C. |

In the case of Example 17, the first polishing was performed using the Slurry 5 and then the second polishing was performed using the Slurry 9. In all of these examples, the polishing rate of the organic film precursor 49 was determined according to a conventional method.

The second organic film 52 was formed on the third hard mask 47 in which the organic film 51 was embedded as shown in FIG. 16 and then the non-uniformity in thickness of the second organic film 52 was determined according to the conventional method. Thereafter, the intermediate layer 54 and the resist film 55 were successively deposited on the second organic film 52 and then the resist film 55 was subjected to exposure to determine the DOF loss. This DOF loss is reflected by the magnitude of the step portion and hence the magnitude of the DOF loss can be determined through the SEM observation of the cross-section of the step portion. Herein, a DOF loss of less than 20 nm was marked by "○", a DOF loss of not less than 50 nm was marked by "×" and a DOF loss falling within the range of 20 to less than 50 nm was marked by "Δ".

After finishing the patterning of the resist film 55, a Cu dual damascene wiring was formed according to the method illustrated with reference to FIGS. 20-25 and the yield of the wiring was measured. Namely, the yield of the wiring was measured using prober, wherein a yield of 80% or more was marked by "○" and a yield of less than 80% was marked by "×".

For the purpose of comparison, the embedding of the organic film precursor 49 was performed under the conditions indicated in the following Table 5 and the polishing rate of the organic film precursor 49 (organic film) was determined according to the conventional method.

TABLE 5

|  | Underlying film | First baking temperature | Slurry | Second baking temperature |
|---|---|---|---|---|
| Com. Ex. 11 | IX370G | 130° C. | 5 | None |
| Com. Ex. 12 | ODL-50 | 150° C. | 5 | None |
| Com. Ex. 13 | IX370G | 130° C. | 6 | None |
| Com. Ex. 14 | ODL-50 | 150° C. | 6 | None |
| Com. Ex. 15 | IX370G | 130° C. | 7 | None |
| Com. Ex. 16 | ODL-50 | 150° C. | 7 | None |
| Com. Ex. 17 | IX370G | 130° C. | 8 | None |
| Com. Ex. 18 | ODL-50 | 150° C. | 8 | None |
| Com. Ex. 19 | IX370G | 130° C. | 10 | None |
| Com. Ex. 20 | ODL-50 | 300° C. | 10 | None |

In the same manner as in the case of Examples, the second organic film 52 was deposited on the third hard mask 47 in which the organic film precursor 49 was embedded and then the non-uniformity in thickness of the second organic film 52 was determined. Thereafter, the intermediate layer 54 and the resist film 55 were successively deposited on the second organic film 52 and then the resist film 55 was subjected to patterning exposure to determine the DOF loss. By following the same method as in the case of Examples, a Cu dual damascene wiring was formed and the yield of the wiring was measured.

The polishing rate of the organic film precursor 49, the non-uniformity in film thickness of the second organic film 52, the DOF loss and the yield of wiring in these Examples and Comparative Examples are summarized in the following Table 6.

TABLE 6

|  | Polishing rate (nm/min) | Non-uniformity in film thickness | DOF loss | Yield of wiring |
|---|---|---|---|---|
| Example 9 | 100 | <10 nm | ○ | ○ |
| Example 10 | 80 | <10 nm | ○ | ○ |
| Example 11 | 100 | <10 nm | ○ | ○ |
| Example 12 | 80 | <10 nm | ○ | ○ |
| Example 13 | 120 | <10 nm | ○ | ○ |
| Example 14 | 90 | <10 nm | ○ | ○ |
| Example 15 | 100 | <10 nm | ○ | ○ |
| Example 16 | 60 | <10 nm | ○ | ○ |
| Example 17 | 100 | <5 nm | ○ | ○ |
| Com. Ex. 11 | 100 | >50 nm | X | X |
| Com. Ex. 12 | 80 | >50 nm | X | X |
| Com. Ex. 13 | 100 | >50 nm | X | X |
| Com. Ex. 14 | 80 | >50 nm | X | X |
| Com. Ex. 15 | 120 | >50 nm | X | X |
| Com. Ex. 16 | 90 | >50 nm | X | X |
| Com. Ex. 17 | 100 | >50 nm | X | X |
| Com. Ex. 18 | 60 | >50 nm | X | X |
| Com. Ex. 19 | 1000 | >50 nm | X | X |
| Com. Ex. 20 | 100 | <20 nm | ○ | X |

In the case of Examples, since the first baking, the CMP and the second baking were performed in the process of embedding the organic film in the recesses, the non-uniformity in film thickness of the second organic film was minimized to less than 10 nm as indicated in the above Table 6, thus making it possible to improve the surface planarity. When the polishing was performed in two steps as in the case of Example 17, the surface planarity was further improved, thus making it possible to reduce the non-uniformity in film thickness of the second organic film to less than 5 nm. Moreover, it was possible to perform the polishing of the organic film precursor at a practical rate.

Due to these reasons, it was possible, in these Examples, to improve the DOF loss as well as the yield of wiring.

Whereas, when the second baking was omitted after the step of CMP, the non-uniformity in film thickness of the second organic film was increased by more than 50 nm, thus deteriorating the surface planarity as indicated by the results of Comparative Examples. Therefore, in all of Comparative Examples, the yield of wiring was "×".

Incidentally, when a slurry containing alumina particles was employed, it was impossible to obtain desirable results irrespective of the baking temperature. As in the case of Comparative Example 19, when the temperature of the first baking is too low, it was impossible to minimize the non-uniformity in film thickness of the second organic film. Further, as in the case of Comparative Example 20, when the temperature of the first baking is too high, the organic film was already created at that moment, thus making it impossible to polish the organic film at a practical polishing rate. In the case of Comparative Example 20, since a hard organic film obtained through high-temperature baking was polished with hard alumina particles, the surface planarity after the polishing was excellent. Therefore, the DOF loss was "○". However, it was impossible to avoid the generation of scratches on the polished surface, thus making it impossible to enhance the yield of wiring.

As seen from the above results, the employment of the method of this embodiment is effective in obtaining a planar organic film. More specifically, it is now possible to enhance the planarity of the resist film to be employed in the step of patterning exposure.

According to embodiments of the present invention, it is possible to provide a method of manufacturing a semiconductor device which is capable of planarizing the organic film while minimizing the generation of defects and of forming a dual damascene wiring at a high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
   forming a coated film by coating a solution containing a solvent and an organic component above an insulating film located above a semiconductor substrate and the insulating film having a recess;
   baking the coated film at a first temperature which does not accomplish cross-linking of the organic component to obtain an organic film precursor;
   after baking the coated film, polishing the organic film precursor using a slurry containing resin particles to leave the organic film precursor in the recess;
   after polishing the organic film precursor, baking the organic film precursor left in the recess at a second temperature which is higher than the first temperature to remove the solvent to obtain a first organic film embedded in the recess;
   after baking the organic film precursor, forming a second organic film by coating on the insulating film where the first organic film is embedded, thereby obtaining an underlying film;
   forming an intermediate layer and a resist film successively above the underlying film; and
   subjecting the resist film to patterning exposure.

2. The method according to claim 1, wherein the insulating film is an interlayer insulating film, the recess is a hole, and an average particle diameter of the resin particles is larger than a diameter of the hole; the method further comprising:
   forming a pattern of a wiring trench in the resist film;
   transcribing the pattern to the interlayer insulating film to form a wiring trench communicating with the hole; and
   forming a dual damascene wiring in the hole and in the wiring trench.

3. The method according to claim 1, wherein the insulating film is a third hard mask containing an inorganic material and formed, above the semiconductor substrate, with at least an organic insulating film, a first hard mask and a second hard mask interposed therebetween, the first hard mask containing an inorganic material, the second hard mask containing an inorganic material, wherein the recess is a pattern of a wiring trench to be transcribed to the organic insulating film and is formed in the third hard mask, the second hard mask being exposed at a bottom of the recess; and the slurry further contains a water-soluble polymer; the method further comprising:
   forming a pattern of a hole in the resist film;
   transcribing the pattern of the hole to the organic insulating film to form a hole in the organic insulating film and, at the same time, removing the underlying film to create the pattern of the wiring trench;
   transcribing the pattern of the wiring trench to the organic insulating film to form a wiring trench communicating with the hole; and
   forming a dual damascene wiring in the hole and in the wiring trench.

4. The method according to claim 1, wherein the organic component is novolac resin.

5. The method according to claim 1, wherein the first temperature is confined to 90-160° C.

6. The method according to claim 5, wherein the second temperature is confined to 250-400° C.

7. The method according to claim 1, further comprising baking the underlying film at a temperature of 250-400° C. prior to forming the intermediate layer.

8. A method for manufacturing a semiconductor device, comprising:
   forming a coated film by coating a solution containing a solvent and an organic component above an interlayer insulating film located above a semiconductor substrate and having a hole;
   baking the coated film at a first temperature which does not accomplish cross- linking of the organic component to obtain an organic film precursor;
   after baking the coated film, polishing the organic film precursor using a slurry containing resin particles to leave the organic film precursor in the hole;
   after polishing the organic film precursor, baking the organic film precursor left in the hole at a second temperature which is higher than the first temperature to remove the solvent to obtain a first organic film embedded in the hole;
   after baking the organic film precursor, forming a second organic film by coating on the interlayer insulating film where the first organic film is embedded, thereby obtaining an underlying film;
   forming an intermediate layer and a resist film successively above the underlying film; and
   subjecting the resist film to patterning exposure.

9. The method according to claim 8, further comprising:
   forming a pattern of a wiring trench in the resist film;
   transcribing the pattern to the interlayer insulating film to form a wiring trench communicating with the hole; and
   forming a dual damascene wiring in the hole and in the wiring trench.

10. The method according to claim 8, wherein the organic component is novolac resin.

11. The method according to claim 8, wherein the first temperature is confined to 90-160° C.

12. The method according to claim 11, wherein the second temperature is confined to 250-400° C.

13. The method according to claim 8, wherein the resin particles has an average particle diameter larger than a diameter of the hole.

14. A method for manufacturing a semiconductor device, comprising:
   forming, a third hard mask containing an inorganic material, above a semiconductor substrate, with at least an organic insulating film, a first hard mask and a second hard mask interposed therebetween, the first hard mask containing an insulating material, the second hard mask containing an insulating material;

forming a pattern of a wiring trench to be transcribed to the organic insulating film in the third hard mask, thereby exposing the second hard mask on a bottom of the pattern;

forming a coated film by coating a solution containing a solvent and an organic component above the third hard mask where the pattern of the wiring trench is formed;

baking the coated film at a first temperature which does not accomplish cross-linking of the organic component to obtain an organic film precursor;

after baking the coated film, polishing the organic film precursor using a slurry containing resin particles to leave the organic film precursor in the pattern of the wiring trench;

after polishing the organic film precursor, baking the organic film precursor left in the pattern of the wiring trench at a second temperature which is higher than the first temperature to remove the solvent to obtain a first organic film embedded in the pattern of the wiring trench;

after baking the organic film precursor, forming a second organic film by coating on the third hard mask where the first organic film is embedded, thereby obtaining an underlying film;

forming an intermediate layer and a resist film successively above the underlying film; and subjecting the resist film to patterning exposure.

15. The method according to claim 14, further comprising:
forming a pattern of a hole in the resist film;

transcribing the pattern of the hole to the organic insulating film to form a hole in the organic insulating film and, at the same time, removing the underlying film to create the pattern of the wiring trench;

transcribing the pattern of the wiring trench to the organic insulating film to form a wiring trench communicating with the hole; and forming a dual damascene wiring in the hole and in the wiring trench.

16. The method according to claim 14, wherein the slurry further comprises a water-soluble polymer.

17. The method according to claim 14, wherein the organic component is novolac resin.

18. The method according to claim 14, wherein the first temperature is confined to 90-160° C.

19. The method according to claim 18, wherein the second temperature is confined to 250-400° C.

20. The method according to claim 14, wherein an average particle diameter of the resin particles is confined to 0.01-5 μm.

* * * * *